United States Patent [19]
Ebneth et al.

[11] 4,439,768
[45] Mar. 27, 1984

[54] METALLIZED SHEET FORM TEXTILE MICROWAVE SCREENING MATERIAL, AND THE METHOD OF USE

[75] Inventors: Harold Ebneth, Leverkusen; Hans-Georg Fitzky, Odenthal, both of Fed. Rep. of Germany

[73] Assignee: Bayer Aktiengesellschaft, Leverkusen, Fed. Rep. of Germany

[21] Appl. No.: 280,961

[22] Filed: Jul. 7, 1981

Related U.S. Application Data

[63] Continuation of Ser. No. 89,713, Oct. 30, 1979, abandoned.

[30] Foreign Application Priority Data

Nov. 2, 1978 [DE] Fed. Rep. of Germany ....... 2847486

[51] Int. Cl.³ .......................................... H01Q 15/00
[52] U.S. Cl. ............................... 343/18 B; 343/18 A; 343/909; 427/404
[58] Field of Search .................. 343/18 R, 18 A, 909, 343/18 B; 427/162, 306, 404, 443.1

[56] References Cited

U.S. PATENT DOCUMENTS

| | | | |
|---|---|---|---|
| 2,447,380 | 8/1948 | Wenger | 427/404 |
| 2,750,321 | 6/1956 | Koppelman | 343/873 |
| 2,814,038 | 11/1957 | Miller | 343/757 |
| 3,047,860 | 7/1962 | Swallow et al. | 343/915 |
| 3,967,010 | 6/1976 | Maekawa | 427/306 |
| 4,064,305 | 12/1977 | Wallin | 343/18 A |
| 4,199,623 | 4/1980 | Nuzzi et al. | 427/443.1 |

*Primary Examiner*—Eli Lieberman
*Attorney, Agent, or Firm*—Sprung, Horn, Kramer & Woods

[57] ABSTRACT

Metallized sheet-form textiles of synthetic polymers or natural fibres to which a metal layer has been applied by wet-chemical currentless deposition are particularly suitable for screening electromagnetic waves in the range from 10 MHz to 1000 GHz. Since the textile properties are substantially unaffected by the metallization, the sheet-form textiles are particularly suitable for use in the medical and communications fields. A multiple-layer construction with insulating intermediate layers and surface linings may be useful, for example in the screening of relatively low frequencies.

14 Claims, 2 Drawing Figures

METALLIZED SHEET FORM TEXTILE MICROWAVE SCREENING MATERIAL, AND THE METHOD OF USE

This is a continuation of application Ser. No. 089,713 filed Oct. 30, 1979, now abandoned.

BACKGROUND OF THE INVENTION

This invention relates to the use of metallised sheet-form textiles for the wide-band screening of microwave and high-frequency radiation in the range from 0.01 to 100 GHz.

By virtue of advances in hardware, coupled with the fact that microwaves can conveniently be concentrated, it is now possible to achieve power densities of 10 W/cm$^2$ in microwave radiation. In many new fields of application, radiation protection against high-frequency electromagnetic alternating fields has also increased in significance (P. Brodeur "The Zapping of America", W. W. Norton & Co., Inc., New York 1977). A radiation dose to the human body of from 10 to 20 mW/cm$^2$ is regarded as the upper limit. It has also been recommended that, in the event of long-term irradiation, the radiation dose should not exceed 1 mW/cm$^2$.

Accordingly, there is a need for screening materials which are capable of attenuating the electromagnetic waves by 30 to 40 dB. In the case of measuring instruments, even higher attenuation may be necessary. The frequency range of the microwave systems mostly used today extends from 1 to 30 GHz. Accordingly, microwave radiation up to 1000 GHz is likely to be used.

Basically, microwaves can be screened on passage through a compact metallic material. However, it is precisely for protecting human beings against radiation and for special technical applications that it is desirable to have a lightweight flexible screening material. Even a fabric of pure metal filaments is heavy and inflexible. Knitted fabrics cannot be produced from metal filaments.

SUMMARY OF THE INVENTION

An object of the present invention is to provide a screening material for microwave and high-frequency radiation which is capable of attenuating the radiation in transmission by at least 30 to 40 dB and which, at the same time, is flexible, has textile elastic properties and is not too heavy. According to the invention, this object is achieved by metallised sheet-form textiles of synthetic polymers or natural fibres, the metal having been applied to the sheet-form textile after activation thereof by currentless wet-chemical deposition with a total metal layer thickness of from 0.02 to 2 μm. If necessary, the metal thus applied may be further reinforced by electrodeposition.

The present invention also relates to the use of metallised sheet-form textiles for screening microwave and high-frequency radiation.

In one special embodiment, the metal layer consists of nickel, cobalt, copper, silver, gold, which may even be in combination or in alloyed form. The sheet-form textile preferably consists of polyurethane, PVC, polyolefin, modacrylic, viscose, polyester, aramide, polyamide, polyacrylonitrile, cotton, either individually or which may even be in combination with one another. The mesh width must be less than half the wavelength of the radiation to be screened. In one particular embodiment, the metallised sheet-form textile material is characterised in that the metallised fibres, filaments, cords or sheet-form textiles are distributed over several layers and insulating intermediate layers or surface coatings or coverings of non-metallised fabrics, films or lacquers are present between the individual metallised layers. In one special embodiment, the sheet-form textile material has isotropic properties. In another special embodiment, the sheet-form textile material has anisotropic properties. In one special embodiment, another metal layer is applied by electrodeposition to the metal layer applied by wet-chemical currentless deposition. More particularly, the present invention relates to the use of metallised sheet-form textiles for radiation protection in the medical and communications fields, as a sealing profile for the electrical sealing of multiple-section metal housings and for shielding rooms.

The material according to the invention is suitable for screening high-frequency and microwave radiation in the range from 0.01 to at least 1000 GHz. Accordingly, the frequency range covered is greater than the range normally encompassed by microwave radiation.

It has been found that the nature of the metallisation has a critical bearing on the effect of the elastic metallised material as a screening material. If an elastic material coated with metal solely by vapour deposition is used, the service properties and the stability of the metal layer on the substrate are poor. However, it has surprisingly been found that the metal layer deposited on the fibre material completely surrounds the individual filaments, but does not affect the elastic properties of the sheet-form textile material, for example woven fabrics, knitted fabrics, non-wovens. Even in the metallised state, each individual fibre remains an individual independent of the other fibres. Remarkably the individual fibres do not melt during the metallisation process which would result in stiffening of the sheet-form textile. In contrast to vapour deposition, uniform penetration of the metal layer through the substrate is also guaranteed, even in the case of non-woven fabrics, felts and bulky knitted fabrics.

The total metal layer thickness should amount to between 0.02 μm and 2 μm. In the case of a nickel layer 0.10 μm thick, the surface resistance is of the order of 10$^2$ ohms, as measured at 23° C. and 50% relative humidity in accordance with DIN 54 345.

The structure of the sheet-form textile, i.e. particularly its textile composition, is instrumental in determining its absorption behaviour. Basically, the sheet-form textiles used may have any construction, i.e. they may be present for example in linen, twill, crepe or other weaves. In selecting the sheet-form textile, it is necessary on the one hand to bear in mind certain practical properties which are not necessarily related to microwave absorption, such as weight or strength. On the other hand, however, it is also necessary to bear in mind those properties of the material which have a direct bearing on its screening behaviour. In this respect, the mesh width and form of the material are particularly important. The mesh width of the material must be less than half the wavelength of the radiation to be screened. It is preferred to use a material of which the mesh width does not exceed 1 to 10% of the wavelength. In addition the screening effect is governed by the mesh form of the material. Accordingly, a textile having a substantially isotropic construction will be used where the screening effect is intended to be isotropic. On the other hand, it is possible by stretching a loose, relatively wide-mesh textile material for the microwave radiation to be partly polarised after its passage through this material where the incident radiation is unpolarised. Where the incident radiation is linearly polarised, the screening effect is particularly good when the mechanical tension and the vector of the electrical field strength are vertically superimposed on one another.

In addition to the mesh width, the depth (thickness) of the woven fabric, knitted fabric, non-woven fabric or felt is important in regard to the screening effect. The screening effect is considerably improved with increasing thickness.

Constructions which provide for a very good screening effect despite the economic use of metal are also of particular interest in this respect. The general construction principles follow the guide lines for so-called honeycomb lattices or honeycomb chimney windows of the type used for screening rooms where a high level of permeability to air and light is also required (cf. Handbuch für Hochfrequenz und Elektrotechniker, Vol. III, pages 913 et seq. published by C. Rint, Verlag für Radio-Foto-Kinotechnik GmbH, Berlin-Borsigwalde 1957). The cross-section and spatial depth of the individual meshes, their spatial staggering, the conductivity, permeability and layer thickness of the metals used contribute differently towards the screening effect. Compared with the screening materials (perforated sheet metal, metal lattices) described in the above-mentioned publication, the metallised sheet-form textiles have the advantage of a full range of textile properties (flexibility, elasticity, wearability, cleanability and the considerably smaller use of metal, weight), so that fundamentally new fields of application are opened up (personal protection, emission control, sealing profiles), Physically, the waves are transmitted through the individual meshes in a tubular or hollow waveguide. The transmission property of a tubular waveguide has a high-pass characteristic, i.e. transmission is possible below a wavelength determined by the maximum transverse dimension (mesh width), cf. the above-mentioned Handbuch, pages 445 et seq. In the stop range, attenuation (screening effect) increases with increasing length of the tubular waveguide (thickness of the fabric) and decreasing cross-section (mesh width). To obtain a good screening effect within a given wavelength range, the mesh width must be less than about half the wavelength and, in addition, the sheet-form textile material must have adequate thickness. If the mesh width is less than the thickness, the screening effect increases proportionally to the thickness. Where the material is of minimal thickness (mesh width greater than the thickness), the model of the tubular waveguide can no longer be used for elucidating the screening effect. In cases such as these, the radiation field penetrates spatially through the meshes.

The screening effect may be improved by reducing the mesh cross-section to 1% and less of the wavelength. However, it is also possible to arrange sheet-form textiles one behind the other. In order to reduce the penetration of the field which has a range of the order of the mesh width, the second layer of the metallised sheet-form textile material should not lie directly on the first layer, instead a non-metallic layer (film, non-metallised fabric) should be provided in between. Such a combination has considerably better flexibility and elasticity than a single sheet-form textile with a correspondingly thicker metal layer for the same screening effect. This multiple-layer construction is particularly preferred for relatively low frequencies (below 100 MHz).

Generally speaking, the metal layer thickness should at least have the value of the skin depth (i.e. the length at which the intensity of the electromagnetic field has fallen to the $1/e^{th}$ part of the value at the surface). At frequencies around 10 GHz and with metals such as nickel or gold, the skin depth amounts to 1 $\mu$m. If the requirement concerning the thickness of the metal layer is satisfied, it is the construction of the fabric which has the greatest influence on the suitability of the metallised sheet-form textile as a screening material. In order to obtain a good screening effect in the frequency range from 10 to 1000 MHz, it is necessary to use relatively thick woven fabrics, knitted fabrics, non-woven fabrics, and, in some cases, even a multiple-layer arrangement.

DETAILED DESCRIPTION OF THE INVENTION

Figure 1:
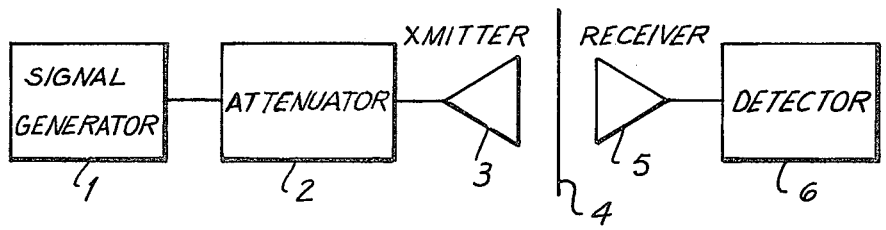
FIG. 1 is a block diagram of a measuring arrangement.

Description of the measuring arrangement is as follows:

The screening effect of the metallised sheet-form textile material is determined by measuring its absorption in transmission. The measuring arrangement is shown in FIG. 1. The electromagnetic radiation is generated in a signal generator 1 and delivered through a calibrated attenuator 2 to a horn antenna 3. An object 4 to be measured is placed in the ray path between the transmitter 3 and a receiving antenna 5. The object may be penetrated perpendicularly and obliquely by the rays. Unless otherwise stated in connection with the following attenuation values, the object to be measured has always been perpendicularly penetrated by the rays, the screening effect being at its weakest with perpendicular penetration.

The receiving field strength at the horn antenna 5 is indicated by a detector 6. The measuring process used is described in H. Groll, Mikrowellenmeßtechnik, F. Vieweg & Sohn, Brunswick, 1969, pages 326 et seq under the heading "Hochfrequente Substitution (High Frequency Substitution)". The attenuation regulator 2 which is directly calibrated in dB is modified in such a way that the detector shows, in the absence of the object to be measured, the same deflection as in its presence for a correspondingly higher transmitting power, i.e. lower attenuation.

In order to eliminate the effect of standing waves in front of and behind the object to be measured (interfacial reflection), a wide-band frequency-modulated radiation of constant power, for example 1.7 to 2.4 GHz or 7 to 8 GHz, is used.

Figure 2:
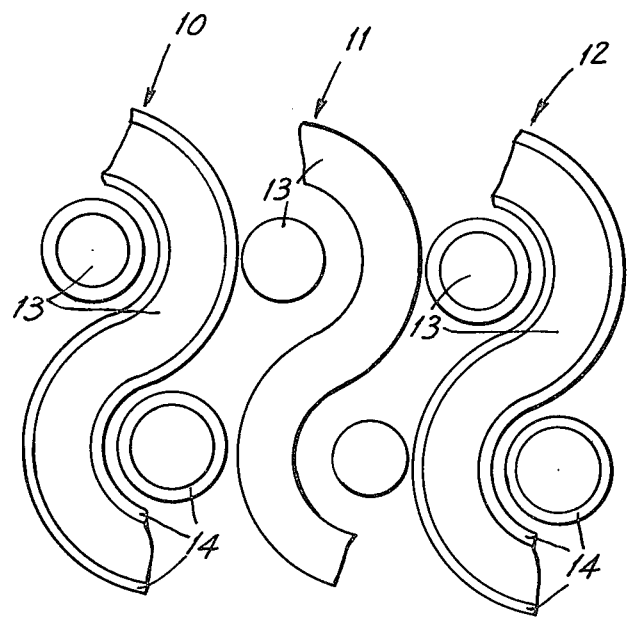
FIG. 2 is a schematic representation of screening material with two metallised woven textile layer separated by an insulating layer of non-metallised woven textile.

In FIG. 2 a screening material for use as metallised cloth, aprons, medical covers, sealing profiles, screened housings and the like for protection against high frequency radiation is shown having two layers 10 and 12 of metallised filamentary woven textiles composed of fibers 13 with metal 14 applied after activation thereof with the total metal layer thickness of about 0.02 to 2.0 micrometers by currentless wet chemical deposition and an insulation layer 11 between the metallised layers 10 and 11 comprising a non-metallised woven textile composed of fibers 13.

The metallisation of sheet-form textiles is described by way of example in the following:

A sheet-form textile material, for example a woven fabric, knitted fabric, non-woven fabric, of synthetic fibres or natural fibres is immersed at room temperature in a hydrochloric acid bath (pH≦1) of a colloidal palladium solution according to German Auslegeschrift No. 1,197,720. After a residence time in the bath of up to about 3 minutes, during which it is gently moved, the fabric is removed and rinsed with water at room temperature. It is then immersed for about 1.5 minutes in an approximately 5% sodium hydroxide solution or 10% soda solution or 5% sulphuric acid or 20% hydrochloric acid at room temperature, rinsed with water for about 30 seconds and subsequently introduced into a standard currentless nickel-plating bath, copper-plating bath or gold-plating bath.

(a) Nickel-plating bath

The nickel bath may consist of 0.2 mole/l of nickel-II-chloride, 0.9 mole/l of ammonium hydroxide, 0.2 mole/l of sodium hypophosphite, into which ammonia is introduced in such a quantity that the pH-value at 20° C. amounts to between about 9.5 and 9.6. After only 10 seconds, the sample begins to turn dark in colour through the deposition of metal. After 20 seconds, the sample floats to the top of the bath with evolution of hydrogen gas and is completely covered with nickel.

Nickel sulphate may also be used as the nickel salt and dimethyl amine borane as the reducing agent. Depositions at elevated temperature using known ionic systems, for example tin chloride, palladium chloride, are also possible.

(b) Copper plating

The following known baths have proved to be suitable for copper plating:

30 g/l of copper sulphate are mixed with 100 g/l of Seignette salt and 50 ml/l of 37% by weight formaldehyde solution and the resulting mixture adjusted with sodium hydroxide to a pH-value of from 11 to 12. After 20 seconds, the surface of the activated material begins to change colour through the deposition of copper accompanied by the evolution of hydrogen gas. After 20 minutes, an approximately 0.8 μm thick layer of copper has been deposited on the surface of the fibres. After liberal rinsing, the fabric is carefully dried to prevent surface oxidation of the copper.

(c) Gold plating

Using known alkaline gold baths, metallic gold may be directly deposited at around 70° C. onto an approximately 0.2 μm thick copper layer produced in accordance with (b) in order to obtain sheet-form textiles with gold-plated surfaces.

The generally described properties are numerically demonstrated in the following Examples.

EXAMPLE 1

With layer thicknesses of from 0.15 to 0.75 μm, attenuations of from 9 to more than 40 dB can be achieved in the frequency range from 1.7 to 24.5 GHz.

| Layer thickness | Frequency range in GHz | | | |
|---|---|---|---|---|
| in μm | 1.7–2.4 | 7–8 | 11–12 | 25–24.5 |
| 0.15 | 9 (10.5) | 13 (13) | 12 (13) | 16.5 (16.5) |
| 0.16 | 11 (14) | 14 (15) | 15 (16) | 18.5 (18.5) |
| 0.20 | 16 (18) | 16 (18) | 16 (18.5) | 20 (21) |
| 0.28 | 19 (19) | 21.5 (22.5) | 19 (21) | 21.5 (23) |
| 0.38 | 26 (26) | 24 (26) | 23 (24) | 22.5 (4) |
| 0.40 | >28 (>28) | 33 (33) | 32 (32) | 34 (34) |
| 0.75 | >40 (>40) | >40 (>40) | >40 (>40) | >40 (>40) |

The metal layer in question is a nickel layer on a 100% polyacrylonitrile filament yarn fabric (beaten filter cloth) having a weight per unit area of 152 g/m². The textile construction is as follows: Warp and weft: 238 dtex of dtex 220 f 96 A 150, with 38.5 warp filaments per cm and 27 weft filments per cm, weave: twill 2/2. The filament yarn fabric is nickel-plated in the same way as described above. The figures quoted in the Table are the attenuation values in dB obtained from transmission measurements of linearly polarised radiation. There are two values to each measurement. The value in brackets is obtained when the fabric has been turned through 90° in the plane of the object. The object of this is to indicate the degree of anisotropy of the absorption in the metal.

EXAMPLE 2

In the case of a high-bulk wide-mesh knitted fabric, attenuation values of more than 40 dB can be achieved for layer thicknesses of the order of 0.15 μm.

| Layer thickness | Frequency range in GHz | | | |
|---|---|---|---|---|
| in μm | 1.7–2.4 | 7–8 | 11–12 | 23–24.5 |
| 0.12 | 20 (13.5) | 23.5 (37) | 33 (38) | 36.5 (36.5) |
| 0.14 | 21.5 (17) | 30 (45) | 36 (47) | 47 (>47) |
| 0.16 | 32 (35.5) | 36.5 (45) | 36.5 (47) | 42 (>47) |

In this case, too, the metal layers in question are nickel layers on a wide-mesh flat-knitted fabric division: 2.5 English, pattern: double-rib with 1:1 needle pitch.

EXAMPLE 3

The influence of mesh width on absorption:

The fabric used is a very coarse spun-fibre woven fabric. Absorption decreases at higher frequencies.

| | Frequency range in GHz | | | |
|---|---|---|---|---|
| | 1.7–2.4 | 7–8 | 11–12 | 23–24.5 |
| Attentuation in dB | >28 (>28) | 21 (24) | 17.5 (21) | 13 (17) |

In this case, the nickel layer thickness is 0.38 μm. The spun-fibre woven fabric is in wide-mesh linen weave, yarn count 8 in warp and weft (50.4 warp filaments/10 cm: 42.2 weft filaments/10 cm, linen weave 1/1).

EXAMPLE 4

In the case of a highly dense spun-fibre woven fabric, absorption shows little dependence on frequency.

| Layer thickness in μm | Frequency range in GHz | | | | | | |
|---|---|---|---|---|---|---|---|
| | 1.7–2.4 | | 7–8 | | 11–12 | | 23–24.5 |
| 0.19 | 17 | (21) | 19 | (21) | 17 (18.5) | 19.5 | (20.5) |
| 0.38 | 28 | (28) | 26.5 | (27.5) | 27 (27.5) | 25 | (26) |

EXAMPLE 5

The influence of mechanical tension on absorption (elongation anisotropy):

Linearly polarised radiation is again used for measurement. For each pair of figures (layer thickness/frequency range), there are 6 absorption values in dB. The values in the first line were determined with the fabric unstretched. The values in the second line, characterised by S′, were determined in the presence of a tension applied parallel to the ribs of knitting. The values in the third line, characterised by S, were determined in the presence of a tension applied perpendicularly to the ribs of knitting. In the case of the unbracketed values, the E-vector of the radiation is perpendicular to the ribs of knitting. In the case of the bracketed values, the E-vector is parallel to the ribs of knitting.

| Nickel layer thickness in μm | | Frequency range in GHz | | | | | | | |
|---|---|---|---|---|---|---|---|---|---|
| | | 1.7–2.4 | | 7–8 | | 11–12 | | 23–24.5 | |
| 0.12 | | 20.5 | (13.5) | 23.5 | (37) | 33 | (38) | 36.5 | (36.5) |
| 0.12 | S′ | 17 | (16) | 29 | (35) | 23.5 | (38) | 24.5 | (38) |
| 0.12 | S | 22.5 | (14) | 25.3 | (24) | 34.5 | (25) | 40 | (26) |
| 0.14 | | 21.5 | (17) | 30 | (45) | 36 | (47) | 47 | (>47) |
| 0.14 | S′ | 19.5 | (20) | 40 | (>47) | 37.5 | (47) | 32.5 | (39) |
| 1.14 | S | 16 | (18) | 30.5 | (30) | 37 | (29.5) | 42 | (30) |
| 0.16 | | 32 | (35.5) | 36.5 | (45) | 36.5 | (47) | 42 | (>47) |
| 0.16 | S′ | 36 | (>40) | 35 | (47) | 36 | (>47) | 47 | (>47) |
| 0.16 | S | 40 | (35) | 43 | (37) | 43 | (39) | 43 | (39) |

EXAMPLE 6

A multiple-layer construction increases the screening effect. In order to increase absorption, particularly at low frequencies, it can be of advantage to use a two-layer or multilayer arrangement. In order to increase the screening effect, an insulating intermediate layer must be present between each metal layer. Surface coatings or coverings of densely metallised non-conductive fabrics, films or lacquers are possible. Even with a double layer of the fabric and a nickel layer thickness of approximately 0.40 μm on each layer, attenuation increases to more than 40 dB throughout the entire frequency range from 1.7 to 25 GHz. Attenuations of approximately 100 dB may be necessary for measuring purposes.

| Number of layers | Frequency range in GHz | |
|---|---|---|
| | 7–8 | 11–12 |
| One | 21 | 21 |
| Two | 33–39 | 38–43 |
| Three | 42–48 | 48–57 |

A layer of unmetallised fabric is present between the layers.

EXAMPLE 7

A polyacrylonitrile of the following composition:
91.1% of acrylonitrile/5.5% of methyl acrylate
3.4% of methallyl sulphonic acid
is dry spun. A fibre yarn fabric was woven from a spun-fibre yarn (yarn count 85/1) of spun fibres of dtex 1.6/40 mm staple length. Warp and weft consist of the same material. The woven fibre yarn fabric has the following construction data:

| Crepe weave | final width: 144 cm (reed width 155 cm, gray width 148 cm) |
|---|---|
| Warp | 33 filaments/cm gray |
| Weft | 30 filaments/cm gray |
| Weight | 84 g/m² |
| Yarn count | Nm 85/2, alpha 115 |
| Staple fibre | 1.6 dtex/40 mm, |
| Finish | washing, brightening |

A 0.38 μm thick nickel layer is applied to this fibre yarn fabric by wet-chemical currentless deposition at room temperature.

The absorption in dB of microwaves in transmission shows the following values:

| Layer | 1.7–2.4 GHz | 7–8 GHz | 11–12 GHz | 23–24.5 GHz |
|---|---|---|---|---|
| I | 25 | 30 (32) | 32 (33.5) | 28.5 (30) |
| II | | 36 (46) | 36 | (41) |
| III | | 29 (38) | 33.5 | (40) |

Whereas layer I indicates the absorption of a sheet-form textile which has not been subjected to any further after-treatment, the same fabric was additionally lined on both sides with flexible PVC in the case of layer II and with polyethylene in the case of layer III. The increase in the screening effect in the case layer II is striking.

Fabrics of this type would appear to be generally sufficient in the medical field for screening certain patients over the body's surface of appliances (for example heart pacemakers)

EXAMPLE 8

A fine cotton lawn having the following textile construction:

| Warp | 380 filaments per 10 cm, approximately 141 dtex (count 70/1) |
|---|---|
| Weft | 260 filaments per 10 cm, approximately 138 dtex (count 70/1) |
| Weave | L 1/1 | is metallised with nickel at room temperature in the same way as described above.

For a 0.75 μm thick nickel layer, the absorption in dB of microwaves in transmission is as follows:

| 1.7–2.5 GHz | 7–8 GHz | 11–12 GHz | 23–24.5 GHz |
|---|---|---|---|
| 25       31 | (35)    32.5 | (40)       28 | (34.5) |

As in the first Examples the values in brackets are obtained when the material is turned through 90° in the plane of the object.

EXAMPLE 9

19.9 kg of dimethyl formamide are mixed while stirring in a vessel with 4.8 kg of glycerol. 5.1 kg of an acrylonitrile copolymer of 95.6% of acrylontrile, 5.7% of methyl acrylate and 0.7% of sodium methyallyl sulphonate are then added with stirring, after which the mixture is stirred for 1 hour at 80° C., filtered and the spinning solution thus obtained dry spun into a spinning duct from a 180-bore jet in known manner.

The duct temperature is 160° C. The viscosity of the spinning solution, which has a solids concentration of 17% and a glycerol content of 15.7% by weight, based on DMF+polyacrylonitrile powder, amounts to 85 ball-drop seconds (as determined in accordance with K. Jost, Rheologica Acta, Vol 1, No. 2.3 (1958), page 303).

The spun material (denier 1700 dtex) is collected on bobbins and doubled to form a tow having an overall denier of 102,000 dtex. After leaving the spinning duct, 14.1% by weight of glycerol is still present in the tow.

The tow is stretched in a ratio of 1:3 in boiling water, washed for 3 minutes under slight tension in boiling water and provided with an antistatic preparation. The tow is then dried in a screen drum drier at a maximum temperature of 130° C. (permitted shrinkage 20%) and cut into fibres having a staple length of 60 mm.

After leaving the spinning duct, the fibres have a pronounced core-jacket structure with an irregular, generally trilobal cross-section, as shown by photographs taken through an electron scan microscope after 780–3800-fold enlargement.

The individual fibres (final denier 3.3 dtex) have a helium density of 1.17 g/cc and a mercury density of 0.862 g/cc for a water retention capacity of 32.8% and a porosity of 26.4%. Their inner surface amounts to 9.7 m²/g and their mean pore diameter to 106 nm. The jacket surface has a hem width of approximately 4 μm. To determine the core and jacket surface of the fibres, more than 100 fibre cross-sections are evaluated by quantitative analysis with a Leitz "Classimat" image analyzer. The results show that on average 32% of the cross-sectional area is occupied by the hem width of the jacket.

The pore filling after 5 minutes in water amounts to 71% (maximum filling level), although from 80 to 90% of this maximum filling level is reached after only 10 seconds.

The porous acrylonitrile fibre thus produced is then metallised. To this end, a flat-knitted fabric is produced from a fibre yarn (count 24/1) using two filaments. The construction is 7 E (English inches) division, pattern smooth/plain.

Without any pretreatment, the sheet-form textile material is directly introduced into a colloidal palladium bath at 1S to 32° C. (pH≦1). The surface is uniformly wetted after only about 5 seconds.

After about 30 seconds, the fabric is removed, rinsed thoroughly with pure water for about 1 minute at room temperature and subsequently introduced into a 5% aqueous sodium hydroxide solution at room temperature to remove the tin(II) and tin(IV)oxide hydrates. After treatment for 2 minutes, during which it is gently moved, the fabric is thoroughly rinsed with pure water for 30 seconds and introduced into a stabilised alkaline nickel chloride solution according to Example 1 at room temperature for depositing the nickel metal onto the palladium-activated fibre or fabric surface. After only 20 seconds the surface of the fibres begins to change colour through the deposition of metal, accompanied by the evolution of gas. After about 5 minutes, approximately 0.2 μm of nickel have been firmly deposited on the fibre surface. The fabric is left in the nickel bath for a total of 20 minutes. An approximately 0.75 μm thick layer of nickel is obtained on the surface of the fibres without the knitted fabric having lost any of its textile character.

The absorption of microwaves in transmission for a 0.75 μm thick nickel layer is as follows:

| 1.7–2.4 GHz | 7–8 GHz | 11–12 GHz | 23–24.5 GHz |
|---|---|---|---|
| 23    (>25) | 19    (>40) | 18.5    (>40) | 21.5    (>40) |

Another striking feature of this elastic knitted fabric is its high degree of anisotropy.

A circular knitted fabric of finer division, for example a fibre yarn (count 40/1) of dtex 2.2/60 15 E (English inches) division, fine rib, pattern: plain/plain, shows the following values for the absorption of microwaves in transmission for 0.75 μm thick nickel layer (values in decibels (dB) for perpendicularly incident linearly polarised radiation):

| | 1.7–2.4 GHz | 7–8 | GHz | 11–12 | GHz | 23–24.5 | GHz |
|---|---|---|---|---|---|---|---|
|    | 17   (12) | 9.7 | (18.5) | 9.5 | (18.5) | 10.5 | (30) |
| S' | >25  (>25) | 32  | (>45)  | 32  | (>45)  | 24   | (42) |
| S' | >25  (>25) | 29  | (35)   | 31  | (35)   | 23   | (36) |

In the case of the unbracketed values, the preferential direction (knitted rib, i.e. rows of stitches above one another) is perpendicular to the E-vector; in the case of the bracketed values, the preferential direction is parallel to the E-vector.

S=tension applied perpendicularly to the preferential direction

S'=tension applied parallel to the preferential direction.

EXAMPLE 10

A fibre yarn knitted fabric having the same textile construction as described in Example 2 is copper plated.

For a 0.9 μm thick copper layer, the absorption of microwaves in transmission showed the following values:

| | 1.7–2.4 GHz | 7–8 | GHz | 11–12 | GHz | 23–24.5 | GHz |
|---|---|---|---|---|---|---|---|
|    | a  32 (35) | 25 | (31)   | 25   | (35)   | 24   | (35) |
|    | b          | 26 | (31.5) | 26.5 | (37)   | 26.5 | (37) |
| S' | a  37 (40) | 38 | (40)   | 39   | (42)   | 33   | (41) |
|    | b          | 40 | (42)   | 40   | (44.5) | 35   | (43.5) |

-continued

| | 1.7–2.4 GHz | 7–8 GHz | 11–12 GHz | 23–24.5 GHz |
|---|---|---|---|---|
| S a | 40 (>40) | 35 (40) | 32.5 (45) | 29 (45) |
| b | | 37 (42) | 33.5 (45) | 30.5 (46.5) | a = incidence angle of the radiation 0°
b = incidence angle of the radiation 30°

EXAMPLE 11

Similarly to Example 10, a 0.2 μm thick copper layer is applied by currentless deposition to a fibre yarn knitted fabric. A 0.35 μm thick gold layer is then applied by currentless deposition to this copper layer. The absorption of a knitted fabric metallised in this way shows the following values in dB:

| | 1.7–2.4 | 7–8 | 11–12 | 23–24.5 |
|---|---|---|---|---|
| a | 25 (25) | 15.5 (24.5) | 19.5 (26.5) | 22 (35) |
| b | | 16.5 (26.0) | 21 (28.5) | 33.5 (37) |
| S' a | 25 (30) | 26 (35) | 33 (38) | 29 (39.5) |
| b | | 27 (37) | 34 (34.5) | 30.5 (41.5) |
| S a | 25 (35) | 27 (37) | 32.5 (38) | 32.5 (41) |
| b | | 27 (37) | 34 (38.5) | 33 (43) |

S' = tension applied parallel to the knitted ribs
S = tension applied perpendicularly to the knitted ribs
a = incidence angle of the radiation 0°
b = incidence angle of the radition 30°

EXAMPLE 12

A filament yarn woven fabric coated with nickel by currentless deposition in accordance with Example 2 is metallised by processes of the type commonly used in the electroplating of plastics. A nickel layer 1 μm thick is applied by electrodeposition to the 0.3 μm thick nickel layer applied by currentless deposition.

For vertical incidence, an attenuation of more than 40 dB is obtained in the range from 1.7 to 12 GHz.

Particular applications for the elastic, metallised material are in the medical and in the technical apparatus field. On the one hand, it is possible to screen or cover the decimeter and microwave apparatus with the metallised, elastic material, although the metallised, elastic material may also be worn by operation and maintenance personnel. By suitably selecting a lightweight textile fabric, freedom of movement is largely maintained. Similarly, patients may be covered with this material over parts of the body which are not to be irradiated. In order to increase resistance to abrasion, the elastic, metallised material may be lacquered, prepared with standard brightening agents, lined with PVC-plasticizer combinations or calendered, for example with polyethylene films.

The metallised, elastic material is also particularly suitable for covering industrial and domestic appliances which give off high frequency radiation (such as for example microwave ovens, microwave driers and heaters) and also devices which must not be exposed to high frequency radiation, for example heart pacemakers. It is also possible in the production of plastics housings to incorporate metallised fibres or fabrics into the housing wall. For screening rooms, all surfaces have to be conductively connected to one another. Gaps or joints have to be electrically sealed. The elastic, metallised material according to the invention is also particularly suitable for use as a sealing profile. It may be pressed into the gaps or joints to be sealed, for example in the form of metallised yarns, string or cord, and thus effectively prevents the emission of high-frequency radiation. Sealing profiles such as these are more elastic, lighter in weight, easier to handle and more adaptable than metallic sealing profiles.

We claim:

1. In a method for screening microwave and high frequency radiation in the range of from 0.01 to 1000 GHz the improvement comprising using as a screening material, at least two layers of metallised filamentary woven textiles composed of synthetic polymers and/or natural fibers with the metal applied after activation thereof with a total metal layer thickness of from 0.02 to 2.0 μm by currentless wet-chemical deposition and having a high surface conductivity and being capable of attenuating waves by 30 to 40 dB and providing insulation between the individual metallised layers.

2. The method according to claim 1, comprising providing a metal layer of nickel, cobalt, copper silver, gold, along, in combination or in alloyed form.

3. The method according to claim 1 or claim 2, comprising providing the filamentary woven textiles comprising cotton, polyacrylonitrile, polyamide, aramide, polyester, viscose, polyolefins, modacrylic, polyurethane, PVC, individually, in combination or in admixture with one another.

4. The method according to claim 1, comprising providing the mesh width of the textile material as less than half the wavelength of the radiation to be screened.

5. The method according to claim 1, comprising providing elastic textile material having isotropic properties.

6. The method according to claim 1, further comprising providing an additional metal layer applied by electrodeposition.

7. The method according to claim 1, for protection against radiation in the medical and communications fields.

8. The method according to claim 1, for screening plastics housings and as sealing profiles for electrical sealing.

9. Screening material for use as metallised cloth, aprons, medical covers, sealing profiles, screened housings and the like for protection against high frequency radiation comprising: at least two layers of metallised filamentary woven textiles composed of synthetic polymers and/or natural fibers with the metal applied after activation thereof with a total metal layer thickness of from 0.02 to 2.0 μm by currentless wet-chemical deposition having a high surface conductivity and being capable of attenuating waves by 30 to 40 dB and insulating between the metallised layers.

10. Screening material according to claim 9, wherein the metal layer is composed of nickel, cobalt, copper, silver and gold, alone, in combination or in alloyed form.

11. Screening material according to claim 9 or claim 10, wherein the textiles comprise cottin, polyacrylonitrile, polyamide, aramide, polyester, viscose, polyolefins, modacrylic, polyurethane, PVC, individually, in combination or in admixture with one another.

12. Screening material according to claim 9, wherein the mesh of the textile material is less than half the wavelength of the radiation to be screened.

13. Screening material according to claim 9, wherein the textile is elastic material having isotropic properties.

14. Screening material according to claim 9, further comprising an additional metal layer applied by electrodeposition.

* * * * *

UNITED STATES PATENT AND TRADEMARK OFFICE
CERTIFICATE OF CORRECTION

PATENT NO. : 4,439,768

DATED : March 27, 1984

INVENTOR(S) : Harold Ebneth et al

It is certified that error appears in the above-identified patent and that said Letters Patent is hereby corrected as shown below:

| | |
|---|---|
| Col. 3, line 41 | Delete "445" and substitute --443-- |
| Col. 6, line 10 | Line 2, last column delete "25-24.5" and substitute --23-24.5-- |
| Col. 9, line 18 | Delete "95.6%" and substitute --93.6%-- |
| Col. 12, line 49 | Delete "insulating" and substitute --insulation-- |
| Col. 12, line 56 | Delete "cottin" and substitute --cotton-- |

Signed and Sealed this

Sixth Day of November 1984

[SEAL]

Attest:

Attesting Officer

GERALD J. MOSSINGHOFF

Commissioner of Patents and Trademarks